United States Patent
Yun et al.

(10) Patent No.: US 10,614,942 B2
(45) Date of Patent: Apr. 7, 2020

(54) INDUCTORS FORMED WITH THROUGH GLASS VIAS

(71) Applicant: QUALCOMM Incorporated, San Diego, CA (US)

(72) Inventors: Changhan Hobie Yun, San Diego, CA (US); Mario Francisco Velez, San Diego, CA (US); Nosun Park, Incheon (KR); Wei-Chuan Chen, San Diego, CA (US); Niranjan Sunil Mudakatte, San Diego, CA (US); Xiaoju Yu, San Diego, CA (US); Paragkumar Ajaybhai Thadesar, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 36 days.

(21) Appl. No.: 16/035,378

(22) Filed: Jul. 13, 2018

(65) Prior Publication Data

US 2020/0020473 A1 Jan. 16, 2020

(51) Int. Cl.
*H01L 23/522* (2006.01)
*H01F 17/00* (2006.01)
*H01L 49/02* (2006.01)
*H01L 27/02* (2006.01)

(52) U.S. Cl.
CPC ..... *H01F 17/0006* (2013.01); *H01L 23/5226* (2013.01); *H01L 23/5227* (2013.01); *H01L 27/0207* (2013.01); *H01L 28/10* (2013.01)

(58) Field of Classification Search
CPC ............. H01F 17/0006; H01L 23/5226; H01L 23/5227; H01L 27/0207; H01L 28/10
See application file for complete search history.

(56) References Cited

U.S. PATENT DOCUMENTS

| | | | |
|---|---|---|---|
| 2007/0013462 A1* | 1/2007 | Fan ...................... | H03H 7/0115 333/185 |
| 2015/0289360 A1* | 10/2015 | Leong ................. | H01L 23/5221 361/782 |
| 2015/0371764 A1* | 12/2015 | Gordin ................ | H01F 17/0013 336/225 |
| 2017/0141756 A1* | 5/2017 | Yun ...................... | H05K 3/4602 |

OTHER PUBLICATIONS

Shorey A.B., et al., "Progress and Application of Through Glass Via (TGV) Technology," 2016 Pan Pacific Microelectronics Symposium, Jan. 25-28, 2016, 6 pages.

* cited by examiner

*Primary Examiner* — Matthew C Landau
*Assistant Examiner* — Dmitriy Yemelanov
(74) *Attorney, Agent, or Firm* — Patterson & Sheridan, L.L.P (57) ABSTRACT

Aspects of the present disclosure provide three-dimensional (3D) through-glass-via (TGV) inductors for use in electronic devices. In some embodiments, a first portion of a 3D TGV inductor may be formed in a first wafer and a second portion of a 3D TGV may be formed in a second wafer. The first portion and second portion may be bonded together in a bonded wafer device thereby forming a larger inductor occupying relatively little wafer space on the first and the second wafers.

20 Claims, 7 Drawing Sheets

INDUCTORS FORMED WITH THROUGH GLASS VIAS

INTRODUCTION

The present disclosure generally relates to integrated circuits (ICs). More specifically, to ICs including three-dimensional inductors formed with through glass vias (TGVs).

Inductors are key components of many ICs, such as oscillators, filters, tuners, and frequency mixers. These ICs are incorporated into many types of electronic devices.

As ICs become more complex and include more components, the number of inductors integrated into those ICs likewise grows. However, challenges arise as the number of inductors needed in an IC increases. For example, an increase in inductors in any given IC means an increase in chip real estate necessary for the inductors. Because the performance of inductors is related to their physical characteristics (e.g., size, length, etc.), it is not possible to simply reduce the size of inductors to fit more on a chip (like a transistor). For example, a particular IC may require a particular value of inductance, which may in-turn require a certain size of an inductor. Another challenge is coupling and interference caused when inductors are packed closely together or close together with other IC elements. These challenges are exacerbated by another prevailing trend in IC design, which is the desire to reduce the size of chips so that electronic devices are smaller, lighter, and more power efficient. The confluence of increasing chip complexity and decreasing chip size means that traditional designs for inductors are not suitable for modern electronic devices.

Accordingly, what is needed are improved inductor designs that allow more inductors to be incorporated into ICs without proportionally increasing the amount of space required for those inductors.

SUMMARY

Certain aspects of the present disclosure provide an apparatus for acoustic filtering. The apparatus may include a device die, comprising: a device die inner surface; a device die outer surface; an acoustic filter formed on the device die inner surface; a plurality of device die vias passing from the device die inner surface to the device die outer surface, the device die vias being formed of a conductive material; a plurality of device die traces formed on the device die outer surface; each trace connecting a first respective device die via to a second respective device die via, each of the plurality of device die traces being formed of the conductive material; and a plurality of device die bond pads formed on the device die inner surface, where at least a subset of the device die bond pads are connected to respective device die vias; and a cap die, comprising: a cap die inner surface; a cap die outer surface; a capacitor formed on the cap die inner surface; a plurality of cap die vias passing from the cap die inner surface to the cap die outer surface, the cap die vias being formed of the conductive material; a plurality of cap die traces formed on the cap die outer surface; each trace connecting a first respective cap die via to a second respective cap die via, each of the plurality of cap die traces being formed of the conductive material; and a plurality of cap die bond pads formed on the cap die inner surface where at least a first subset of the cap die bond pads are connected to respective cap die vias, where each respective device die bond pad of the plurality of device die bond pads is metal bonded to respective cap die bond pad of the plurality of cap die bond pads, and where at least a first subset of the device die traces, the first subset of the device die bond pads connected to the respective device die vias, at least a first subset of the cap die traces, and the first subset of the cap die bond pads connected to the respective cap die vias form a first inductor.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Aspects of the present disclosure provide a solution to the problem of providing sufficient numbers of inductors (and inductance density) without increasing on-chip (or on-die) footprint. In particular, a three-dimensional (3D) inductor may be formed in-part in a top (or cap) wafer and in-part in a bottom (or device) wafer of a bonded wafer (or chip) device. The top portion(s) of the inductor(s) and the bottom portion(s) of the inductor(s) may be joined, for example, when the wafers are joined together, so as to form inductors with more cross-sectional area, which improves the inductance value of the inductors. Accordingly, using the full extent of bonded wafer (or chip) devices, rather than just one wafer or the other, allows an increase in the number of inductors and the inductance density without proportionally increasing the wafer (or chip) size.

Inductors in Integrated Circuits

Inductors are one of three passive linear circuit elements (also including capacitors and resistors) that make up electronic circuits.

Inductors have many uses in electronic circuits, such as in filters that separate signals of different frequencies. For example, an inductor in combination with a capacitor forms an "LC circuit," which can act as an electrical resonator, storing energy oscillating at the circuit's resonant frequency. LC circuits may be used for generating signals at a particular frequency, or for picking out a signal at a particular frequency from a more complex signal, which is known as bandpass filtering. Thus, LC circuits are key components of other circuit elements, such as oscillators, filters, tuners, and frequency mixers, which are incorporated into many types of electronic devices, such as acoustic devices and radio frequency (RF) devices.

An inductor is characterized by its inductance, which is the ratio of the voltage to the rate of change of current. The formula to calculate inductance is:

$$L = \frac{N^2 \mu A}{l}$$

In the formula above, L is the inductance, N is the number of turns in a wire coil, μ is the permeability, A is the cross-sectional area of the coil, and l is the length of the coil. Based on the formula, inductance may be increased by adding more turns (N), increasing the permeability (μ) (e.g., by adding a magnetic core), increasing the cross-sectional area of the coil (A), and/or decreasing the length of the coil (l).

Inductors generally possess a small resistance in addition to inductance. The lower the value of this resistance R, the better the quality of the inductor. The quality factor (Q) of an inductor at the operating frequency co is defined as the ratio of reactance of the coil to its resistance. Referring back to the formula above, inductance density is typically enhanced by increasing the number of coil turns, N, however, at the expense of the coil resistance, which degrades the quality factor. A lower quality factor Q can have negative effects such as power consumption, which can reduce battery life and generate heat in electronic devices, and in applications such as filters, can reduce performance.

In general, incorporation of magnetic materials as inductor cores can enhance the inductance density and reduce the need for the number of coil turns, thereby increasing the quality factor. However, magnetic materials introduce other challenges because of intrinsic eddy currents, hysteresis losses and magnetic saturation at low currents which causes the inductance to droop with the DC current. Further, magnetic materials may require additional space, which is increasingly scarce in modern IC design.

Related Art Inductor Designs

Figure 1A:
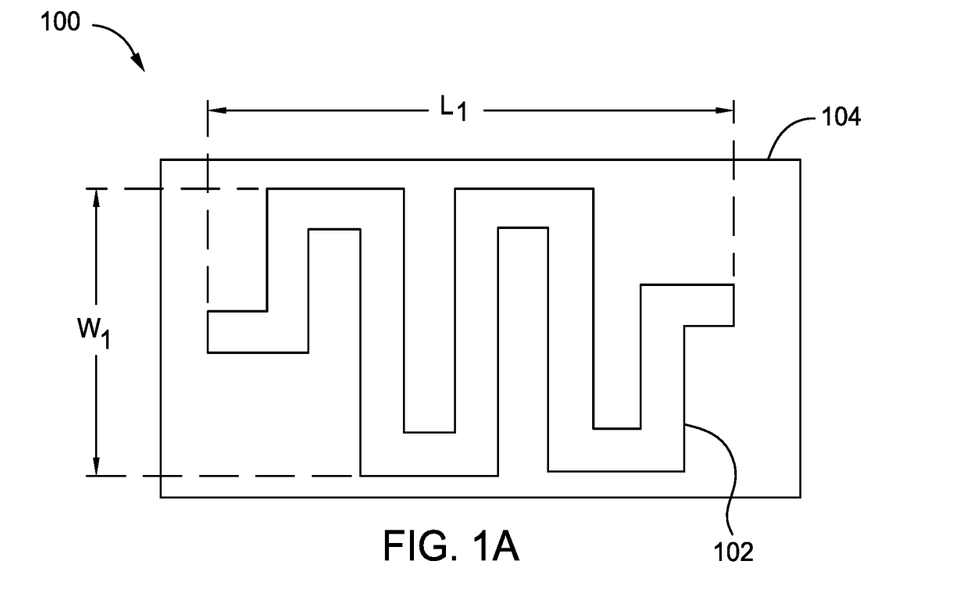
FIG. 1A depicts an example of a two-dimensional (2D) planar meander inductor design.

One inductor design for IC chips is a two-dimensional (2D) planar "zigzag" or "meander line" inductor. FIG. 1A shows one conventional planar meander inductor 100, formed of a meander conductor 102 extending on the top plane of a substrate 104. Planar meander inductors as shown in FIG. 1 can have certain shortcomings. One can be area, i.e., the product of L1 and W1, the meander conductor 102 occupies on the surface of the substrate 104. Another shortcoming can be a low Q due in part to the dielectric properties of the substrate 104.

Figure 1B:
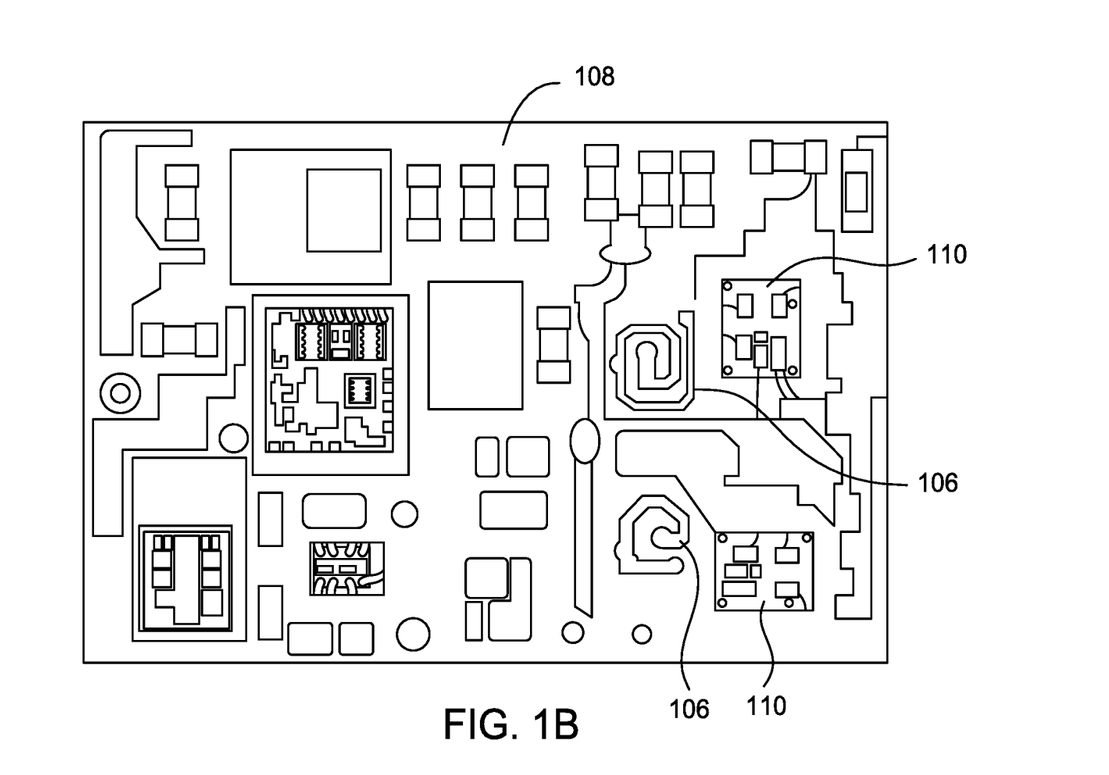
FIG. 1B depicts examples of 2D planar coil inductors.

FIG. 1B illustrates another example of a 2D planar inductor design, namely that of a planar coil inductor. As depicted in FIG. 1B, two planar coil inductors 106 are disposed on substrate 108. In this example, the planar coil inductors 106 are associated with bonded-chip elements 110. For example, bonded-chip elements 110 may be filters. As is plain in FIG. 1B, the planar coil inductors, like the meander line inductor in FIG. 1A, requires a significant amount of space on the substrate 108.

Three-dimensional conductors are also used in ICs. In fact, a conventional inductor design is that of a 3D coil. However, as electronic devices have shrunk, inductor designs have become increasingly sophisticated. Rather than install inductors on chips, inductors may be fabricated at the same time as other components using, for example, deposition, etching, patterning, and other fabrication techniques. For example, U.S. patent application Ser. No. 14/229,317 describes three-dimensional (3D) pillar meander inductors, 3D pillar rectangular spiral inductors, and three dimensional pillar coil inductors. Further, U.S. patent application Ser. No. 15/160,776 describes 3D wirewound inductor integrated within substrates.

Three-Dimensional Through-Glass-Via Inductors

Figure 2A:
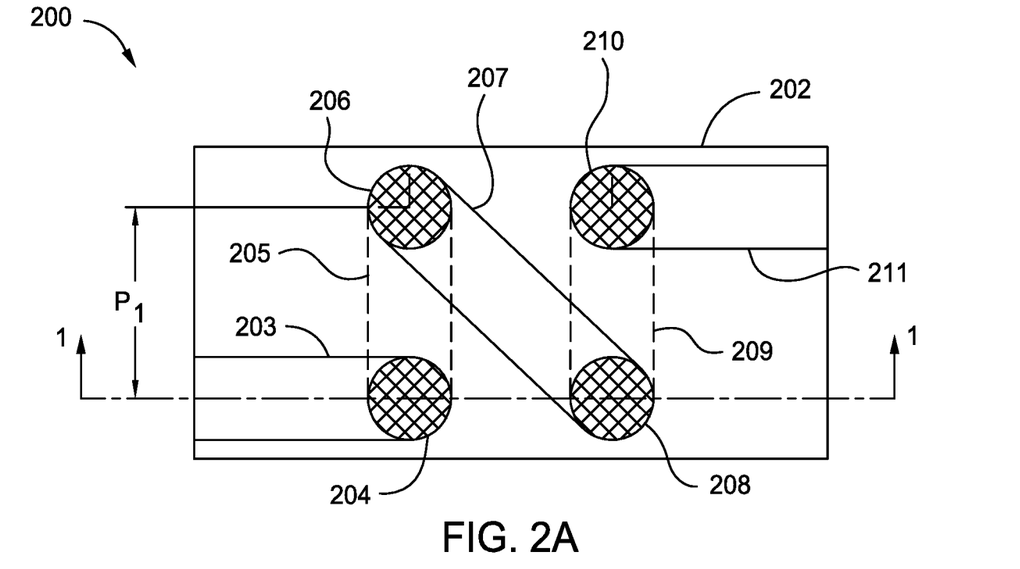
FIG. 2A depicts a three-dimensional (3D) through-glass-via (TGV) inductor design.
Figure 2B:
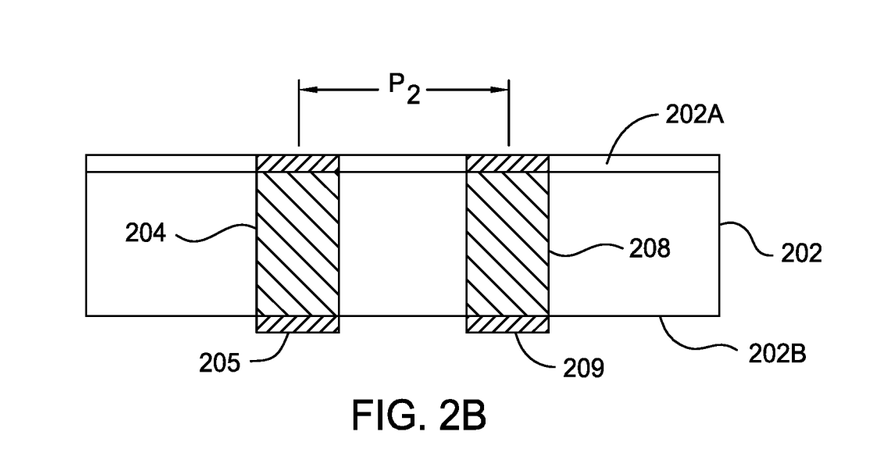
FIG. 2B is a projection on the 1-1 cut plane of the 3D TGV inductor of FIG. 2A.

FIGS. 2A and 2B depict a three-dimensional (3D) through-glass-via (TGV) inductor design. In particular, FIG. 2A is a top view of 3D TGV inductor 200, from a direction normal to the top surface 202A of glass substrate 202.

Starting from left, a horizontal conducting member 203 (e.g. a trace) on the top surface 202A of glass substrate 202 moves right to vertical conducting member 204 (e.g., here, a TGV). From there, vertical conducting member 204 goes through glass substrate 202 and connects to horizontal conducting member 205 on the bottom surface 202B of glass substrate 202. From there horizontal conducting member 205 connects to vertical conducting member 206, which goes back up through glass substrate 202. On surface 202A again, vertical conducting member 206 connects to horizontal conducting member 207, which moves diagonally across the top surface 202A of substrate 202. Horizontal conducting member 207 connects to vertical conducting member 208, which goes down through glass substrate 202 and connects to horizontal conducting member 209. Horizontal conducting member 209 moves across bottom surface 202B of substrate 202 to connect with vertical conducting member 210. Vertical conducting member 210 goes back up through glass substrate 202 and finally connects with horizontal conducting member. P1 is a first pitch distance between the TGVs.

FIG. 2B is a cross-cut projection view from the FIG. 2A cutting plane 1-1. Referring to FIG. 2B depicts vertical conducting members 204 and 208 (here, TGVs) passing through glass substrate 202. P2 is a second pitch distance between the TGVs.

FIGS. 2A and 2B thus show an example of a 3D TGV coil inductor 200 built into a single glass substrate 202. TGV 3D inductor 200 may have a higher Q and higher inductance compared to a comparable conventional planar meander inductor or planar coil inductor, as depicted above with respect to FIGS. 1A and 1B.

Three Dimensional Through-Glass-Via Inductors in Bonded-Wafer Applications

Various exemplary embodiments can also provide inductor structures having features and benefits that can include, but are not limited to, higher inductance density, higher Q, ease of fabrication and compatibility with known conventional IC design and fabrication techniques.

Figure 3:
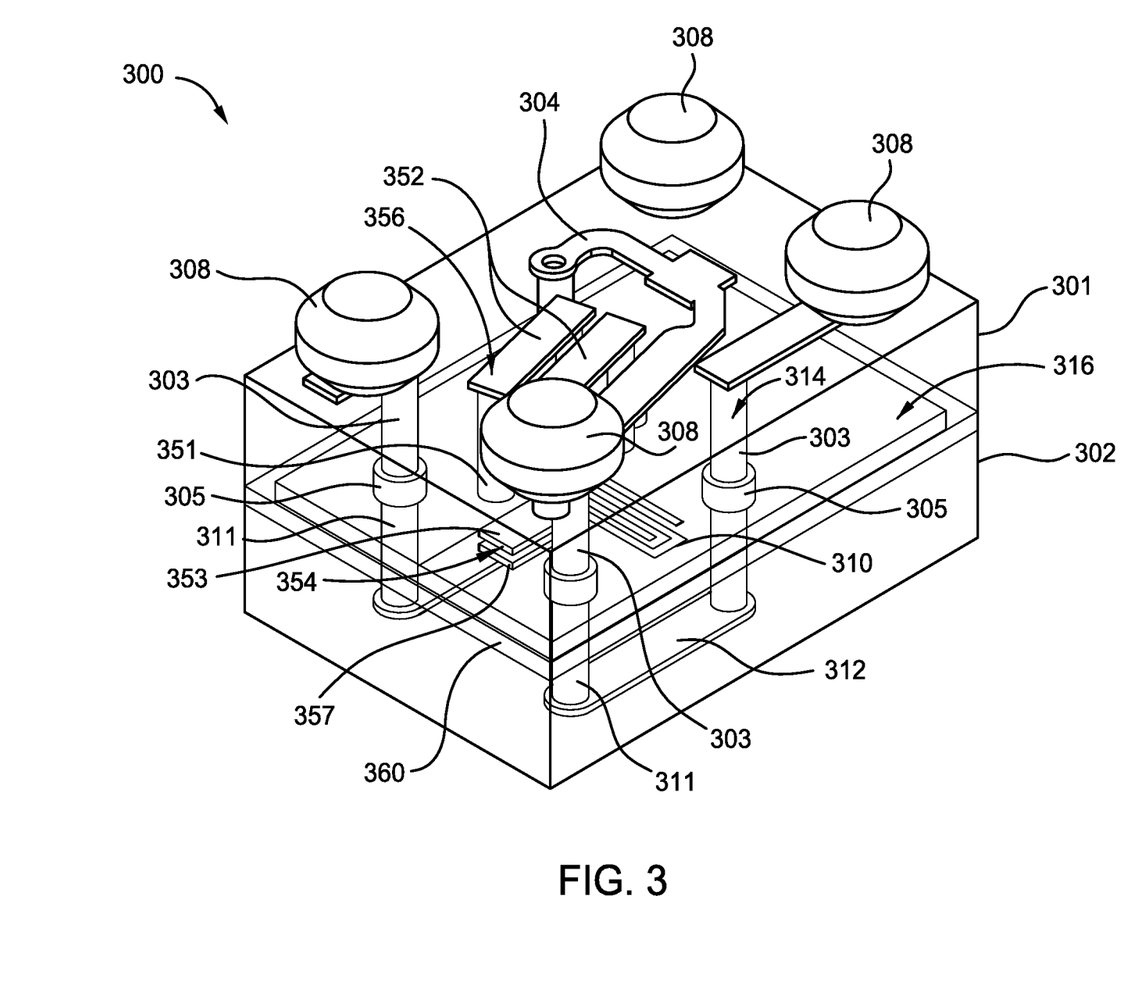
FIG. 3 depicts an example of an improved 3D TGV inductor design used in a bonded-chip application.

FIG. 3 illustrates a three-dimensional (3D) view of a 3D through-glass-via (TGV) inductor design integrated in a bonded-wafer (or bonded-chip) electronic device 300. Electronic device 300 includes a top (or cap) wafer 301 bonded to a bottom (or device) wafer 302 via a metallic bonding ring 360. In this embodiment, metallic bonding ring 360 hermetically seals the components within the void formed between the top (cap) wafer and the bottom (device) wafer, such as filter device 310. The hermetic seal provided by metallic bonding ring 360 may be particularly useful when acoustic components (such as SAW filters) are disposed within the sealed area because such components are sensitive to any materials touching the acoustic components.

Electronic device 300 includes a first, large 3D TGV inductor 314 formed by top wafer trace 304 (i.e., horizontal conducting member) connected to top wafer vias 303 (i.e., vertical conducting members) disposed in the top wafer 301. Top wafer vias 303 connect to bottom wafer vias 311 by bond pads 305, which are situated between top wafer 301 and bottom wafer 302, and which electrically connect top wafer 301 to bottom wafer 302. This connection allows the cross-sectional area of the "coil" to be increased (and thus the inductance) without increasing the size of electronic device 300. Bottom wafer vias 311 are connected by bottom wafer trace 312, which in this example is disposed on the outer (bottom-most) surface of bottom wafer 302. For example, bottom wafer trace 312 may be formed by back end of line (BEOL) fabrication techniques.

The outer surface of top wafer 301 includes bumps 308, which may be used for connecting electronic device 300 to other devices.

FIG. 3 includes a second, small 3D TGV inductor 356 in addition to large inductor 314. Small 3D TGV inductor 356 is formed with top wafer traces 352 connecting to top wafer vias 351 and a bottom trace (not shown) on the inner surface of top wafer 301. In this example, the small 3D TGV inductor 356 is formed in top wafer 301 only.

A filter device 310 is formed on inner surface 316 of bottom wafer 302 and is hermetically sealed between the top wafer 301 and the bottom wafer 302. In this example, metallic bonding ring 360 provides for the hermetic sealing. Filter device 310 is formed of an inductor connected to a capacitor 354, which is formed on an inner surface of top wafer 301 with trace 353 and capacitor plate 357 on either side of a dielectric material (not shown). The capacitor 354 is disposed between top wafer 301 and bottom wafer 302.

FIG. 3 thus depicts a plurality of inductors formed using TGVs (i.e., vertical conducting elements) and surface traces (i.e. horizontal conducting elements). Unlike the planar inductor designs depicted in FIGS. 1A and 1B, the 3D TGV inductors occupy relatively little space on the wafer surfaces, which leaves room for other circuit elements, such as filter device 310. Moreover, here large 3D TGV-based inductor 314 takes advantage of the vertical extent of electronic device 300 to maximize cross-sectional area of the inductor coil(s), which may improve the inductance value. An inductor using only one wafer, such as small inductor 356 would typically entail more windings (as shown) to accomplish similar performance.

Further, by using both wafers in electronic device 300, one 3D TGV inductor (e.g., 356) is able to be placed within the extent of another 3D TGV inductor (e.g., 314), which allows more inductors to be formed per unit volume. Additionally, by using different vias and different directions of traces, the orientations of various 3D TGV inductors in FIG. 3 are able to be designed such that the various 3D TGV inductors exhibit less coupling with each other, and thus better performance.

While the example depicted in FIG. 3 has 3D TGV inductors built solely into the top wafer (e.g., 356) and into the top and bottom wafer (e.g., 314), many other arrangements are possible. For example, an electronic device such as electronic device 300 might include a combination of single-wafer 3D TGV inductors (e.g., in the top wafer 301, in the bottom wafer 302, or in both the top wafer 301 and the bottom wafer 302) as well as dual-wafer 3D TGVs (e.g., 314), which take advantage of the full extent of electronic device 300. The mixing and matching of these various alternatives allows for more inductors to be included into electronic devices as well as allowing higher performance inductors.

Figure 4A:
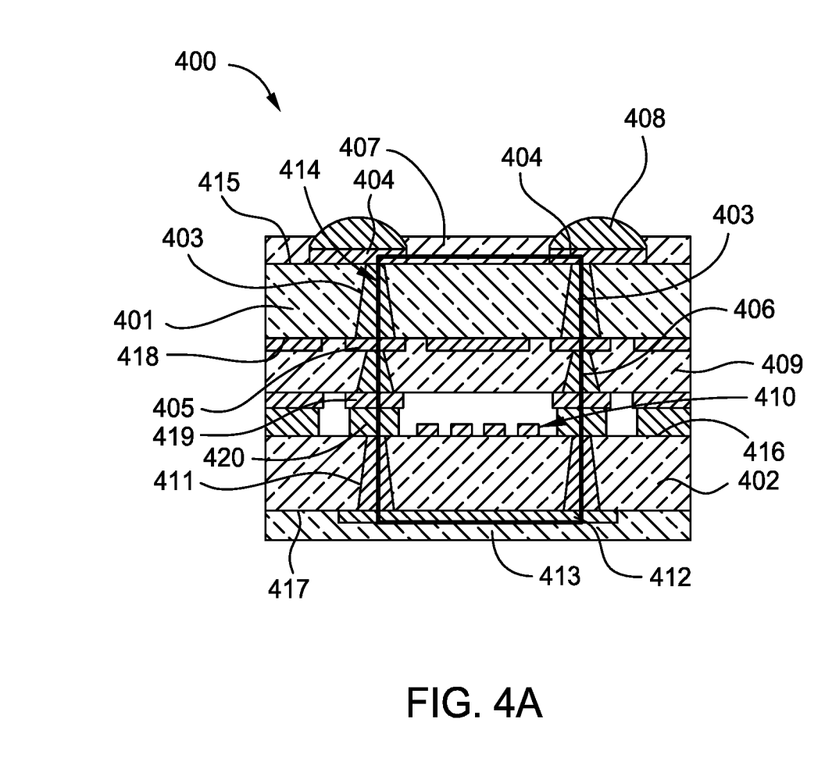
FIGS. 4A and 4B depict examples of improved 3D TGV inductor designs used in bonded-chip applications.

FIG. 4A illustrates a cross-sectional view of an electronic device 400, which includes 3D TGV inductors. Like in FIG. 3, electronic device 400 has a top wafer 401 and a bottom wafer 402 that are bonded together to form a bonded chip device.

A large 3D TGV coil is formed starting with top wafer traces 404 on the outer (top) surface of top wafer 401 which are connected to a plurality of conductive top wafer vias 403 disposed in top wafer 401. The top wafer vias 403 are further connected to first bond pads 405, inter-wafer vias 406, second bond pads 419, and third bond pads 420. Third bond pads 420 are connected to bottom wafer vias 411, which are connected to bottom wafer traces 412. In this embodiment, bottom wafer traces 412 are disposed on the outer (bottom) surface 417 of bottom wafer 402. In this example, inter-wafer vias 406 go through an insulation layer 409 in order to connect top wafer vias 403 and bottom wafer vias 411 so that a large 3D TGV inductor coil 414 is formed. One or more of bumps 408 may be coupled to top wafer traces 404.

In one example, there may be a plurality of vertical coil portions. For example, a top wafer trace 404 may be connected to a first vertical coil portion and a second vertical coil portion. Similarly, a bottom wafer trace 412 may be connected to one of the first or second vertical coil portions, but not the other one, which forms a coil instead of a loop.

In this example, a top passivation layer 407 is disposed on the outer surface 415 of the top wafer 401. Similarly, a bottom passivation layer 413 is disposed on the outer surface 417 of bottom wafer 402. Passivation layers 407 and 413 act as a non-conductive shield material that does not react with top wafer traces 404 or bumps 408.

Figure 4B:
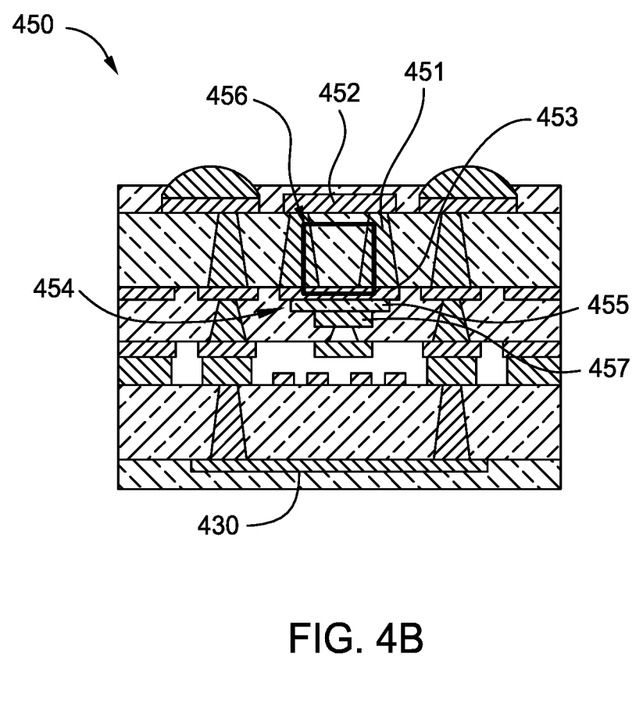

In the example depicted in FIGS. 4A and 4B, an insulation layer 409 is disposed between top wafer 401 and bottom wafer 402. Insulation layer 409 may comprise a material that is non-conductive with inter-wafer vias 406, first bond pads 405, second bond pads 419, and third bond pad 420s. In some examples, insulation layer 409 may comprise a dielectric material.

Further disposed between top wafer 401 and bottom wafer 402 is filter device 410. In this example, filter device 410 is disposed on inner surface 416 of bottom wafer 402, which may accordingly be referred to as the device wafer. In this example, filter device 410 is hermetically sealed in an area between top wafer 401 and bottom wafer 402. Filter device 410 could be, for example, a Surface Acoustic Wave (SAW) filter. In other embodiments, different types of filter devices may be included in electronic device 400, such as Bulk Acoustic Wave (BAW) filters, Film Bulk Acoustic Resonators (FBAR), and others.

As with FIG. 3, here the large 3D TGV inductor 414 occupies relatively little space on the wafer surfaces, which leaves room for other circuit elements, such as filter device 410. And here again, large 3D TGV-based inductor 414 takes advantage of the vertical extent of electronic device 400 to maximize cross-sectional area and thus inductance density. An inductor using only one wafer, such as small inductor 456 in FIG. 4B, would generally involve more windings to accomplish similar inductance density.

FIG. 4B illustrates a cross-sectional view of an electronic device 450 with a large 3D TGV inductor (same as in FIG. 4A) and a small 3D TGV inductor 456 (same as in FIG. 3).

Small 3D TGV inductor 456 comprises a plurality of top wafer vias 451 disposed in top wafer 401. At one end of top wafer vias 451 (on outer surface 415 of top wafer 401), top wafer traces 452 connect top wafer vias 451. On the other end of top wafer vias 451 (on inner surface 418 of top wafer 401), top wafer vias 451 are connected by a bottom surface trace 453. Thus a small (relative to large inductor 414) inductor 456 is formed. Similar to the inductor described above, the vias provide vertical portions of an inductor coil.

Electronic device 450 also includes a capacitor 454, which is disposed between top wafer 401 and bottom wafer 402 and within insulation layer 409. In this embodiment, capacitor 454 is formed by a bottom surface trace 453, dielectric material 455, and capacitor plate 457. Notably, in this way the bottom surface trace 453 acts as both part of small 3D TGV inductor 456 and as part of capacitor 454, which reduces the need for additional structures and gains space on the wafer for other circuit elements.

Small 3D TGV inductor 456 coupled with capacitor 454 may form an "LC circuit," also referred to as a resonant circuit, tuned circuit, tank circuit, or the like. This LC circuit could form part of a filter in electronic device 450.

The large 3D TGV inductor in FIG. 4B (not indicated) may for example be associated with filter device 410. For example, the large 3D TGV inductor may act as an inductor for capacitive devices in filter 410.

Similar to FIG. 3, FIG. 4B depicts the ability to build 3D TGV inductors within the extent of other 3D TGV inductors, which allows more inductors to be formed per unit volume. In some embodiments, inductors such as 414 (not indicated in FIG. 4B) and 456 may be described as nested inductors.

Figure 5:
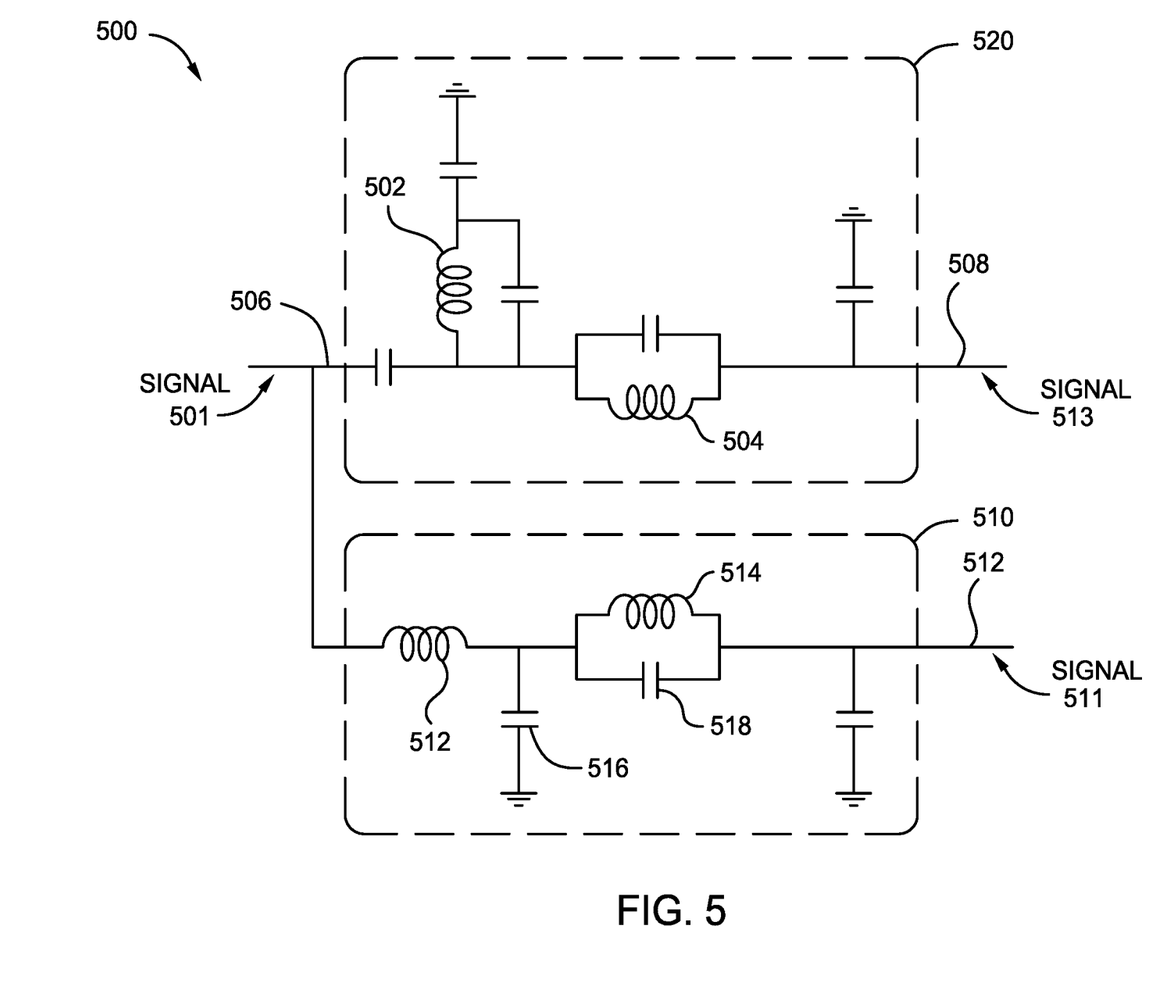
FIG. 5 illustrates an example of a diplexer (DPX) circuit, which may use 3D TGV inductors.

FIG. 5 illustrates an example of a diplexer (DPX) circuit 500, which may use 3D TGV inductors as described above with respect to FIGS. 3, 4A, and 4B.

For example, DPX circuit 500 may include an inductor 502 and an inductor 504. In some implementations, one or both of the inductors 502, 504, 512, and 514, any of which may correspond to one of the 3D TGV inductors described with respect to FIGS. 3, 4A, and 4B. For example, inductor 514 and capacitor 518 could correspond to small 3D TGV inductor 456 and capacitor 454 in FIG. 4B.

DPX circuit 500 includes a node 506, which could be coupled to one or more antennas or to one or more amplifiers (e.g., one or more low noise amplifiers (LNAs)) that are responsive to one or more antennas. DPX circuit 500 may further include a node 508 and a node 512. The nodes 508, 512 could be coupled to a set of antenna switches, as one example.

A first portion 510 of DPX circuit 500 may correspond to a first filter, such as low-pass filter, and a second portion 520 of DPX circuit 500 may correspond to a second filter, such as a high-pass filter. The low-pass filter and high-pass filters may utilize 3D TGV inductors as described above with respect to FIGS. 3, 4A, and 4B.

During operation, the node 506 may receive a signal 501, such as from an antenna coupled to DPX circuit 500. The first portion 510 and the second portion 520 may filter signal components of one or more signals, such as the signal 501. The first portion 510 may generate a signal 511, and the second portion 520 may generate a signal 513. To illustrate, the signal 511 may correspond to a LB signal, and the signal 513 may correspond to an HB signal. The signal 511 may be associated with a first frequency range (e.g., a cellular frequency range), and the signal 513 may be associated with a second frequency range (e.g., a WiFi frequency range). In an illustrative example, the node 512 is configured to provide the signal 511 to one or more antenna switches, and the node 508 is configured to provide the signal 513 to one or more antenna switches.

The example of FIG. 5 illustrates certain aspects that may improve operation of a circuit, such as a DPX circuit. For example, by using the 3D TGV inductors (as described with respect to FIGS. 3, 4A, and 4B) in the first portion 510 of the DPX circuit 500, operation of the first portion 510 may be more similar to an "ideal" low-pass filter as compared to certain other devices (e.g., due to enhanced Q of the 3D TGV inductors). In this case, the signal 511 may contain fewer signal components associated with the signal 513, which may result in enhanced signal quality of the signal 511.

Figure 6:
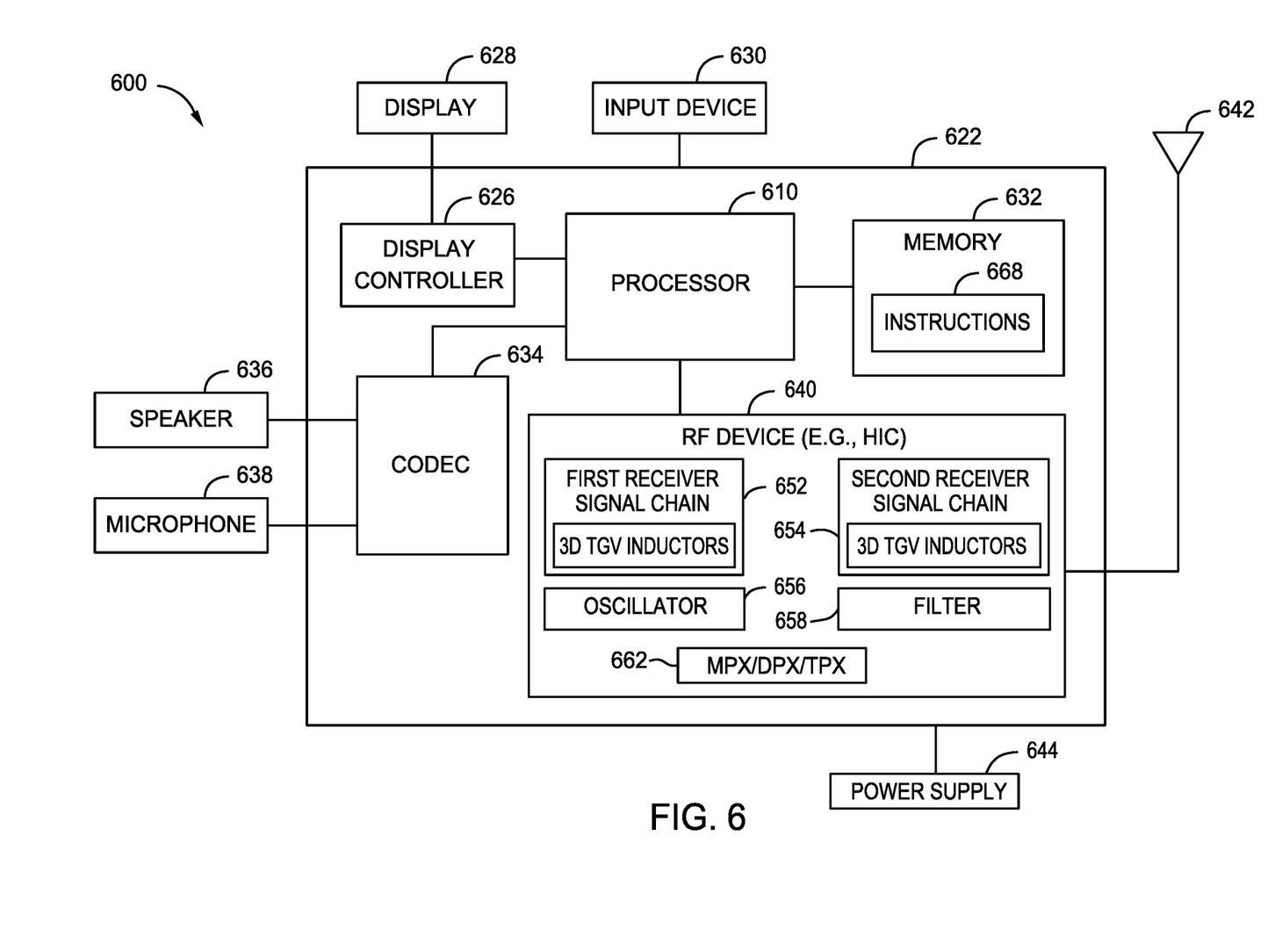
FIG. 6 depicts a block diagram of an example of an electronic device, which may use 3D TGV inductors.

FIG. 6 depicts a block diagram of an example of an electronic device 600, which may use 3D TGV inductors as described above with respect to FIGS. 3, 4A, and 4B. The electronic device 600 may correspond to a mobile device (e.g., a cellular telephone, smartphone, smart wearable device, or the like), as an illustrative example. In other implementations, the electronic device 600 may correspond to a computer (e.g., a server, a laptop computer, a tablet computer, or a desktop computer), an access point, a base station, a wearable electronic device (e.g., a personal camera, a head-mounted display, or a watch), a vehicle control system or console, a home appliance, a set top box, an entertainment unit, a navigation device, a personal digital assistant (PDA), a television, a monitor, a tuner, a radio (e.g., a satellite radio), a music player (e.g., a digital music player or a portable music player), a video player (e.g., a digital video player, such as a digital video disc (DVD) player or a portable digital video player), a robot, a healthcare device, another electronic device, or a combination thereof.

The electronic device 600 includes a processor 610. The processor 610 may include a digital signal processor (DSP), a central processing unit (CPU), a graphics processing unit (GPU), another processing device, or a combination thereof.

The electronic device 600 may further include a memory 632. The memory 632 may be coupled to or integrated within the processor 610. The memory 632 may store instructions 668 that are executable by the processor 610. To further illustrate, the memory 632 may include random access memory (RAM), magnetoresistive random access memory (MRAM), flash memory, read-only memory (ROM), programmable read-only memory (PROM), erasable programmable read-only memory (EPROM), electrically erasable programmable read-only memory (EEPROM), one or more registers, a hard disk, a removable disk, a compact disc read-only memory (CD-ROM), another storage device, or a combination thereof.

The electronic device 600 may further include a radio frequency (RF) device 640. The RF device 640 may correspond to an RF receiver front-end device, a hybrid integrated circuit (HIC), or both, as illustrative examples. In some implementations, the RF device 640 may be included in a first wafer (or an HIC) that is separate from a second wafer that includes one or more other components of the electronic device 600, such as the processor 610 and the memory 632. As an illustrative example, the first wafer (or HIC) may correspond to the bottom (or device) wafer 302 of FIG. 3 or 402 of FIGS. 4A and 4B. The second wafer may correspond to the top (or cap) wafer 301 of FIG. 3 and 401 of FIGS. 4A and 4B. The first die (or HIC) and the second die may be included in a system-in-package (SiP) device, such as the bonded chip devices described with respect to FIGS. 3, 4A, and 4B.

The RF device 640 may include one or more receiver signal chains, such as a first receiver signal chain 652 and a second receiver signal chain 654. The first receiver signal chain 652 or the second receiver signal chain 654 may include the a 3D TGV inductor and a capacitor as described with respect to FIGS. 3 and 4B. In some embodiments, the first receiver signal chain 652 may correspond to a low-band receiver signal chain, and the second receiver signal chain 654 may correspond to a high-band receiver signal chain. In some implementations, the first receiver signal chain 652 corresponds to a cellular receiver signal chain, and the second receiver signal chain 654 corresponds to a WiFi receiver signal chain. At least one of the first receiver signal chain 652 and the second receiver signal chain 654 may be associated with a frequency range of approximately 0.5 GHz to 5.5 GHz, as illustrated in the example of the graph 550 of FIG. 5.

The RF device 640 may include an oscillator 656, a filter 658, and a circuit 662 that includes one or more of an MPX circuit, a DPX circuit (e.g., the DPX circuit 500 of FIG. 5), or a TPX circuit. It is noted that, depending on the particular application, one or more of the oscillator 656, the filter 658, and the circuit 662 may include one or more 3D TGV inductors as described above with respect to FIGS. 3, 4A, and 4B.

FIG. 6 also shows a display controller 626 that is coupled to the processor 610 and to a display 628. A coder/decoder (CODEC) 634 can also be coupled to the processor 610. A speaker 636 and a microphone 638 can be coupled to the CODEC 634. FIG. 6 also indicates that an antenna 642 may be coupled to the RF device 640.

In a particular example, the processor 610, the display controller 626, the memory 632, the CODEC 634, and the RF device 640 are included in or attached to an SiP or PCB device 622. Further, an input device 630 and a power supply 644 may be coupled to the SiP or PCB device 622. Moreover, in a particular example, as illustrated in FIG. 6, the display 628, the input device 630, the speaker 636, the microphone 638, the antenna 642, and the power supply 644 are external to the SiP or PCB device 622. However, each of the display 628, the input device 630, the speaker 636, the microphone 638, the antenna 642, and the power supply 644 can be coupled to a component of the SiP or PCB device 622, such as to an interface or to a controller. In some implementations, the RF device 640 may be integrated within a base station.

Figure 7:
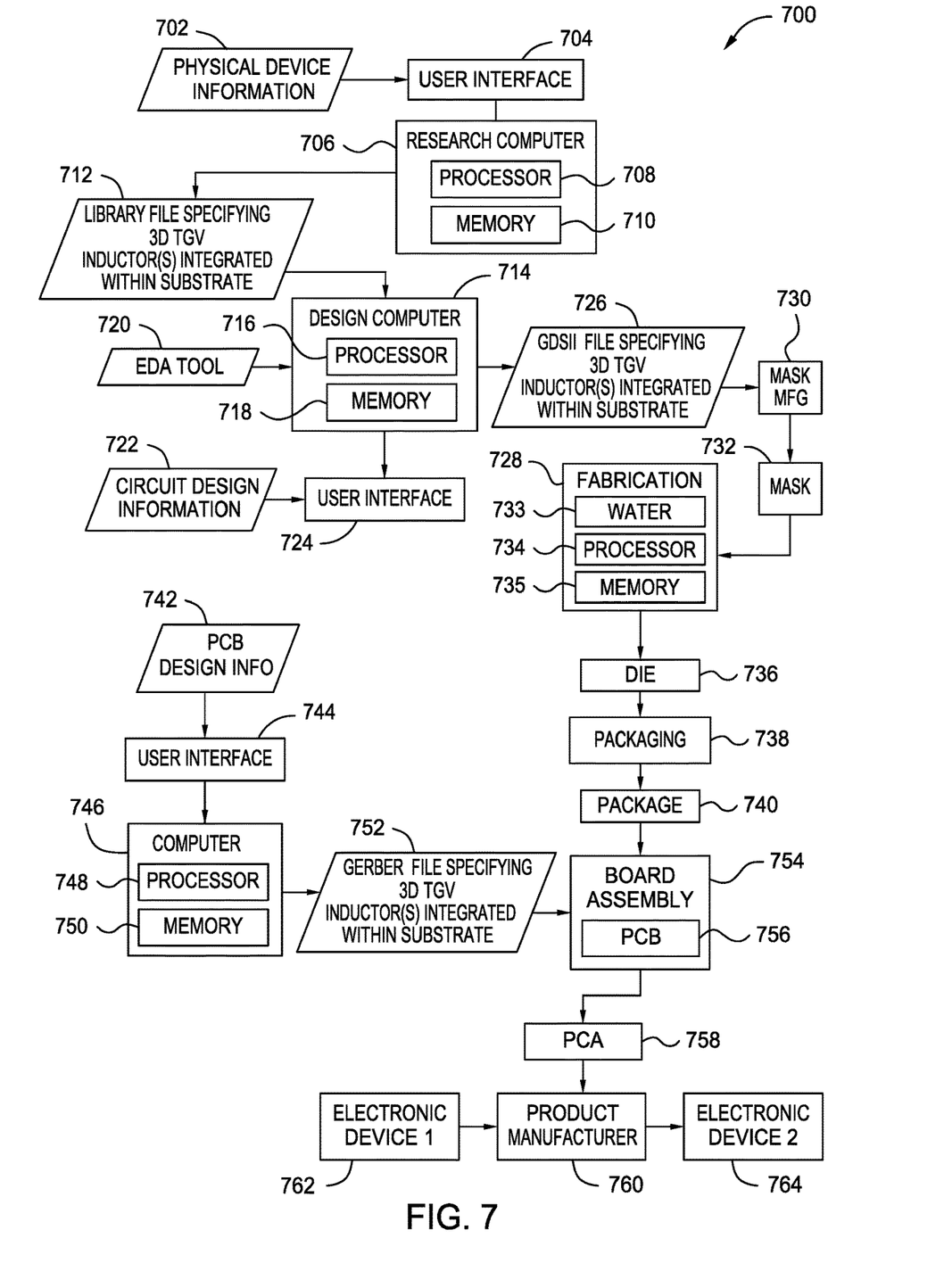
FIG. 7 depicts a particular illustrative example of an IC manufacturing process.

FIG. 7 depicts a particular illustrative example of an electronic device manufacturing process 700.

Physical device information 702 is received at the electronic device manufacturing process 700, such as at a research computer 706. The physical device information 702 may include design information representing at least one physical property of a device, such as devices 300, 400, and 450 of FIGS. 3, 4A, and 4B, that includes a substrate including one or more 3D TGV inductors, such as the 3D TGV described with respect to FIGS. 3, 4A, and 4B. For example, the physical device information 702 may include physical parameters, material characteristics, and structure information that is entered via a user interface 704 coupled to the research computer 706. The research computer 706 includes a processor 708, such as one or more processing cores, coupled to a computer readable medium, such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may specify a library of devices (e.g., for use with an electronic design automation (EDA) tool 720) including a substrate having one or more 3D TGV inductors, such as the 3D TGV inductors described with respect to FIGS. 3, 4A, and 4B.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit including a substrate including one or more 3D TGV inductors, such as the 3D TGV inductors described with respect to FIGS. 3, 4A, and 4B. For example, a user of the design computer 714 may enter circuit design information 722 via a user interface 724 coupled to the design computer 714. The circuit design information 722 may include design information representing at least one physical property of a substrate including one or more 3D TGV inductors, such as the 3D TGV inductors described with respect to FIGS. 3, 4A, and 4B. To illustrate, the circuit design information 722 may identify particular circuits and relationships to other elements in a circuit design, positioning information, feature size information, interconnection information, or other information representing a physical property of a device.

The design computer 714 may be configured to transform the design information, including the circuit design information 722, to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing a substrate including one or more 3D TGV inductors, such as the 3D TGV inductors described with respect to FIGS. 3, 4A, and 4B, in addition to other circuits or information.

The GDSII file 726 may be received at a fabrication process 728 to manufacture a device that includes a substrate including one or more 3D TGV inductors, such as the 3D TGV inductors described with respect to FIGS. 3, 4A, and 4B, according to transformed information in the GDSII file 726. For example, a device manufacture process may include providing the GDSII file 726 to a mask manufacturer 730 to create one or more masks, such as masks to be used with photolithography processing, illustrated as a representative mask 732. The mask 732 may be used during the fabrication process to generate one or more wafers 734, which may be tested and separated into dies, such as a representative die 736. The die 736 includes a substrate including one or more 3D TGV inductors, such as the 3D TGV inductors described with respect to FIGS. 3, 4A, and 4B.

To further illustrate, a processor 733 and a memory 735 may initiate and/or control the fabrication process 728. The memory 735 may include executable instructions, such as computer-readable instructions or processor-readable instructions. The executable instructions may include one or more instructions that are executable by a processor, such as the processor 733.

The fabrication process 728 may be implemented by a fabrication system that is fully automated or partially automated. For example, the fabrication process 728 may be automated according to a schedule. The fabrication system may include fabrication equipment (e.g., processing tools) to perform one or more operations to form a device. For example, the fabrication equipment may be configured to deposit one or more materials, epitaxially grow one or more materials, conformally deposit one or more materials, apply a hardmask, apply an etching mask, perform etching, perform planarization, and/or perform a wafer cleaning process, etc.

The fabrication system (e.g., an automated system that performs the fabrication process 728) may have a distributed architecture (e.g., a hierarchy). For example, the fabrication system may include one or more processors, such as the processor 733, one or more memories, such as the memory 735, and/or one or more controllers that are distributed according to the distributed architecture. The distributed architecture may include a high-level processor that controls or initiates operations of one or more low-level systems. For example, a high-level processor may include one or more processors, such as the processor 733, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 733.

Alternatively, the processor 733 may be a part of a high-level system, subsystem, or component of the fabrication system. In another embodiment, the processor 733 initiates or controls distributed processing operations associated with multiple levels and components of a fabrication system.

Thus, the processor 733 may include processor-executable instructions that, when executed by the processor 733, cause the processor 733 to initiate or control formation of a device, such as devices 300, 400, and 456 described above with respect to FIGS. 3, 4A, and 4B. The device may include one or more materials formed using one or more doping tools, such as a molecular beam epitaxial growth tool, a flowable chemical vapor deposition (FCVD) tool, a conformal deposition tool, and/or a spin-on deposition tool. During fabrication of the device, one or more materials may be removed (e.g., etched) from the device using one or more removal tools, such as a chemical removal tool, a reactive gas removal tool, a hydrogen reaction removal tool, a planarization tool, and/or a standard type removal tool.

The executable instructions included in the memory 735 may enable the processor 733 to initiate or control formation of a device or structure described herein. For example, the executable instructions may enable the processor 733 to initiate or control formation a substrate, such as wafers 301, 302, 401, 402 described above with respect to FIGS. 3, 4A, and 4B, such as using a molding process. The die 736 may include the substrate and one or more 3D TGV inductors integrated within the substrate, such as the 3D TGV inductors described with respect to FIGS. 3, 4A, and 4B. The die 736 may have a passive-on-glass (PoG) configuration.

The die 736 may be provided to a packaging process 738 where the die 736 is incorporated into a representative package 740. For example, the package 740 may include the single die 736 or multiple dies, such as a system-in-package (SiP) arrangement or a bonded chip arrangement as described above with respect to FIGS. 3, 4A, and 4B. The package 740 may be configured to conform to one or more standards or specifications, such as Joint Electron Device Engineering Council (JEDEC) standards. In some implementations, the package 740 includes one or more of the device 300, 400, or 450 as described above with respect to FIGS. 3, 4A, and 4B.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged device on a circuit board. The packaged device may correspond to the package 740, and the package 740 may include a substrate including one or more 3D TGV inductors, such as the 3D TGV inductors described with respect to FIGS. 3, 4A, and 4B.

The computer 746 may be configured to transform the PCB design information 742 to generate a data file, such as a GERBER file 752, with data that includes physical positioning information of a packaged device on a circuit board, as well as layout of electrical connections such as traces and vias. The packaged device may correspond to the package 740 and may include a substrate including one or more 3D TGV inductors, such as the 3D TGV inductors described with respect to FIGS. 3, 4A, and 4B. In other embodiments, the data file generated by the transformed PCB design information may have a format other than a GERBER format.

The GERBER file 752 may be received at a board assembly process 754 and may be used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a mobile device, a computer, a set top box, a music player, a video player, an entertainment unit, a navigation device, a communications device, a personal digital assistant (PDA), or a "fixed" location data device (e.g., a base station). As another illustrative, non-limiting example, one or more of the electronic devices 762 and 764 may include mobile phones, hand-held personal communication systems (PCS) units, portable data units such as personal data assistants, global positioning system (GPS) enabled devices, navigation devices, "fixed" location data devices such as base stations and meter reading equipment, or any other device that stores or retrieves data or computer instructions, or any combination thereof. It should be appreciated that the disclosure is not limited to these illustrated devices.

A device that includes a substrate including one or more 3D TGV inductors, such as the 3D TGV inductors described with respect to FIGS. 3, 4A, and 4B, may be fabricated, processed, and incorporated into an electronic device, as described in the electronic device manufacturing process 700. One or more aspects of the embodiments disclosed with respect to FIGS. 3, 4A, and 4B may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the electronic device manufacturing process 700 may be performed by a single entity or by one or more entities performing various stages of the electronic device manufacturing process 700.

The preceding description is provided to enable any person skilled in the art to practice the various embodiments described herein. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

A processing system may be implemented with a bus architecture. The bus may include any number of interconnecting buses and bridges depending on the specific application of the processing system and the overall design constraints. The bus may link together various circuits including a processor, machine-readable media, and input/output devices, among others. A user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media, such as any medium that facilitates transfer of a computer program from one place to another. The processor may be responsible for managing the bus and general processing, including the execution of software modules stored on the computer-readable storage media. A computer-readable storage medium may be coupled to a processor such that the processor can read information from, and write information to, the storage medium. In the alternative, the storage medium may be integral to the processor. By way of example, the computer-readable media may include a transmission line, a carrier wave modulated by data, and/or a computer readable storage medium with instructions stored thereon separate from the wireless node, all of which may be accessed by the processor through the bus interface. Alternatively, or in addition, the computer-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module, it will be understood that such functionality is implemented by the processor when executing instructions from that software module.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. An electronic apparatus, comprising:
a device wafer, comprising:
a device wafer inner surface;
a device wafer outer surface;
an acoustic filter formed on the device wafer inner surface;
a plurality of device wafer vias passing from the device wafer inner surface to the device wafer outer surface, wherein the plurality of device wafer vias are formed of a conductive material;
a plurality of device wafer traces formed on the device wafer outer surface, wherein:
each device wafer trace of the plurality of device wafer traces connects a first device wafer via of the plurality of device wafer vias to a second device wafer via of the plurality of device wafer vias, and
the plurality of device wafer traces are formed of the conductive material; and
a plurality of device wafer bond pads formed on the device wafer inner surface, wherein at least a first subset of device wafer bond pads of the plurality of device wafer bond pads are connected to a first subset of respective device wafer vias of the plurality of device wafer vias; and
a cap wafer, comprising:
a cap wafer inner surface;
a cap wafer outer surface;
a plurality of cap wafer vias passing from the cap wafer inner surface to the cap wafer outer surface, wherein the plurality of cap wafer vias are formed of the conductive material;
a plurality of cap wafer traces formed on the cap wafer outer surface, wherein:
each cap wafer trace of the plurality of cap wafer traces connects a first cap wafer via of the plurality of cap wafer vias to a second cap wafer via of the plurality of cap wafer vias, and
the plurality of cap wafer traces are formed of the conductive material; and
a plurality of cap wafer bond pads formed on the cap wafer inner surface, wherein at least a first subset of cap wafer bond pads of the plurality of cap wafer bond pads are connected to a first subset of respective cap wafer vias of the plurality of cap wafer vias,
wherein each device wafer bond pad of the plurality of device wafer bond pads is metal bonded to a cap wafer bond pad of the plurality of cap wafer bond pads,
and wherein a first subset of device wafer traces of the plurality of device wafer traces, the first subset of device wafer bond pads, a first subset of cap wafer traces of the plurality of cap wafer traces, and the first subset of cap wafer bond pads form a first inductor.

2. The apparatus of claim 1, further comprising:
a capacitor formed on the cap wafer inner surface, wherein:
the capacitor comprises a first cap wafer bond pad and a capacitor top plate separated by a dielectric layer, and
the first cap wafer bond pad is connected to a second subset of cap wafer vias of the plurality of cap wafer vias.

3. The apparatus of claim 1, further comprising:
a first passivation layer disposed over the device wafer outer surface, wherein the plurality of device wafer traces are disposed in the first passivation layer; and
a second passivation layer disposed over the cap wafer outer surface, wherein the plurality of cap wafer traces are disposed in the second passivation layer,
wherein the first passivation layer and the second passivation layer are formed of a non-conductive material.

4. The apparatus of claim 1, wherein;
the acoustic filter is a surface acoustic wave filter, and the acoustic filter is located within a cross-sectional area of a coil of the first inductor.

5. The apparatus of claim 1 further comprising:
a plurality of inter-wafer vias,
wherein the plurality of inter-wafer vias are disposed between the first subset of device wafer bond pads and the first subset of cap wafer bond pads.

6. The apparatus of claim 1, further comprising:
a second subset of device wafer traces of the plurality of device wafer traces; and
a second subset of device wafer bond pads of the plurality of device wafer bond pads,
wherein:
the second subset of device wafer bond pads are connected to respective device wafer vias of the plurality of device wafer vias to form a second inductor, and
the first inductor has a first inductance different than a second inductance of the second inductor.

7. The apparatus of claim 6, wherein the first inductance of the first inductor is greater than the second inductance of the second inductor.

8. The apparatus of claim 6, wherein the second inductor is located within a winding cross-sectional area of the first inductor.

9. The apparatus of claim 1, further comprising:
a second subset of cap wafer traces of the plurality of cap wafer traces; and
a second subset of cap wafer bond pads of the plurality of cap wafer bond pads,
wherein:
the second subset of cap wafer traces and the second subset of cap wafer bond pads are connected to respective cap wafer vias to form a second inductor, and
the first inductor has a first inductance different than and a second inductance of the second inductor.

10. The apparatus of claim 9, wherein a winding cross-sectional area of the first inductor is greater than a winding cross-sectional area of the second inductor.

11. The apparatus of claim 1, further comprising: a metallic bonding ring forming a bond between the device wafer and the cap wafer.

12. The apparatus of claim 11, wherein the metallic bonding ring creates a hermetic seal within a void formed between the device wafer inner surface and the cap wafer inner surface.

13. The apparatus of claim 1, wherein the acoustic filter is a bulk acoustic wave filter, and wherein the acoustic filter is located within a cross-sectional area of a coil of the first inductor.

14. The apparatus of claim 1, further comprising:
a memory comprising executable instructions; and
a processor in data communication with the memory.

15. The apparatus of claim 14, further comprising:
a speaker; and
a microphone.

16. The apparatus of claim 15, further comprising: a display.

17. The apparatus of claim 16, further comprising:
a radio frequency device,
wherein the radio frequency device comprises the device wafer and the cap wafer.

18. The apparatus of claim 17, further comprising an input device.

19. The apparatus of claim 16, wherein the display comprises a touch-sensitive display.

20. The apparatus of claim 19, wherein the apparatus is a smartphone.

* * * * *